United States Patent [19]

Tanimura

[11] Patent Number: 4,783,768
[45] Date of Patent: Nov. 8, 1988

[54] SEMICONDUCTOR MEMORY

[75] Inventor: Nobuyoshi Tanimura, Tokyo, Japan

[73] Assignee: Hitachi, Ltd., Tokyo, Japan

[21] Appl. No.: 42,367

[22] Filed: Apr. 24, 1987

Related U.S. Application Data

[63] Continuation of Ser. No. 720,896, Apr. 8, 1985, abandoned.

[30] Foreign Application Priority Data

Apr. 6, 1984 [JP] Japan .................................. 59-67687

[51] Int. Cl.$^4$ .............................................. G11C 8/00
[52] U.S. Cl. ..................................... 365/230; 365/222; 365/189
[58] Field of Search ............... 365/189, 203, 222, 230, 365/233, 240

[56]  References Cited

U.S. PATENT DOCUMENTS

| | | | |
|---|---|---|---|
| 4,321,695 | 3/1982 | Redwine et al. | 365/240 X |
| 4,322,635 | 3/1982 | Redwine | 365/240 X |
| 4,564,925 | 1/1986 | Onishi | 365/189 X |
| 4,581,718 | 4/1986 | Oishi | 365/189 |

FOREIGN PATENT DOCUMENTS 2152711  8/1985  United Kingdom .

Primary Examiner—Joseph A. Popek
Attorney, Agent, or Firm—Antonelli, Terry & Wands

[57]  ABSTRACT

A semiconductor memory is disclosed which comprises a memory array, an address counter designating the address of the memory array, a shift register to which the data signals read out from the memory array are preset, and a control circuit. When all the data preset to the shift register is shifted out to an external terminal, the control circuit updates the address counter. The data produced from the new address of the memory array is again preset to the shift register. The same operation is thereafter repeated, thereby producing serial data signals at the external terminal. The semiconductor memory having such a construction can read out continuous data signals without any need for external address signals.

36 Claims, 5 Drawing Sheets

SEMICONDUCTOR MEMORY

This is a continuation of application Ser. No. 720,896, filed Apr. 8, 1985, now abandoned.

BACKGROUND OF THE INVENTION

This invention relates to a semiconductor memory, and to a technique which is effective when utilized for a dynamic RAM (random access memory) incorporating therein an address counter circuit for automatic refresh, for example.

When a figure is displayed on a CRT (cathode ray tube), data in the form of logic "0" and logic "1" in accordance with dots constituting the figure is written in advance into memory. The figure is displayed by sequentially reading out the data written into the memory in synchronism with the CRT raster scan timing. When a dynamic RAM is used as a refresh memory for displaying such a figure (or character), address signals must be sequentially generated from an external control circuit such as a micro-processor or the like.

The inventor of this invention developed a semiconductor memory which can easily effect a read-out operation in a predetermined sequence such as that with the refresh memory described above. As an example of the prior art references describing in detail the dynamic RAM, mention can be made of Japanese Patent Laid-Open No. 82282/1982.

SUMMARY OF THE INVENTION

An object of the present invention is to provide a semiconductor memory capable of effecting easily the read-out operation in a predetermined sequence.

This and other objects and novel features of the present invention will become more apparent from the following description to be taken in conjunction with the accompanying drawings.

Among the inventions disclosed herein, the following will illustrate a typical example. In accordance with the present invention, memory cells are selected in a predetermined sequence by address signals generated by a built-in address counter.

DESCRIPTION OF THE PREFERRED EMBODIMENTS

Figure 1:
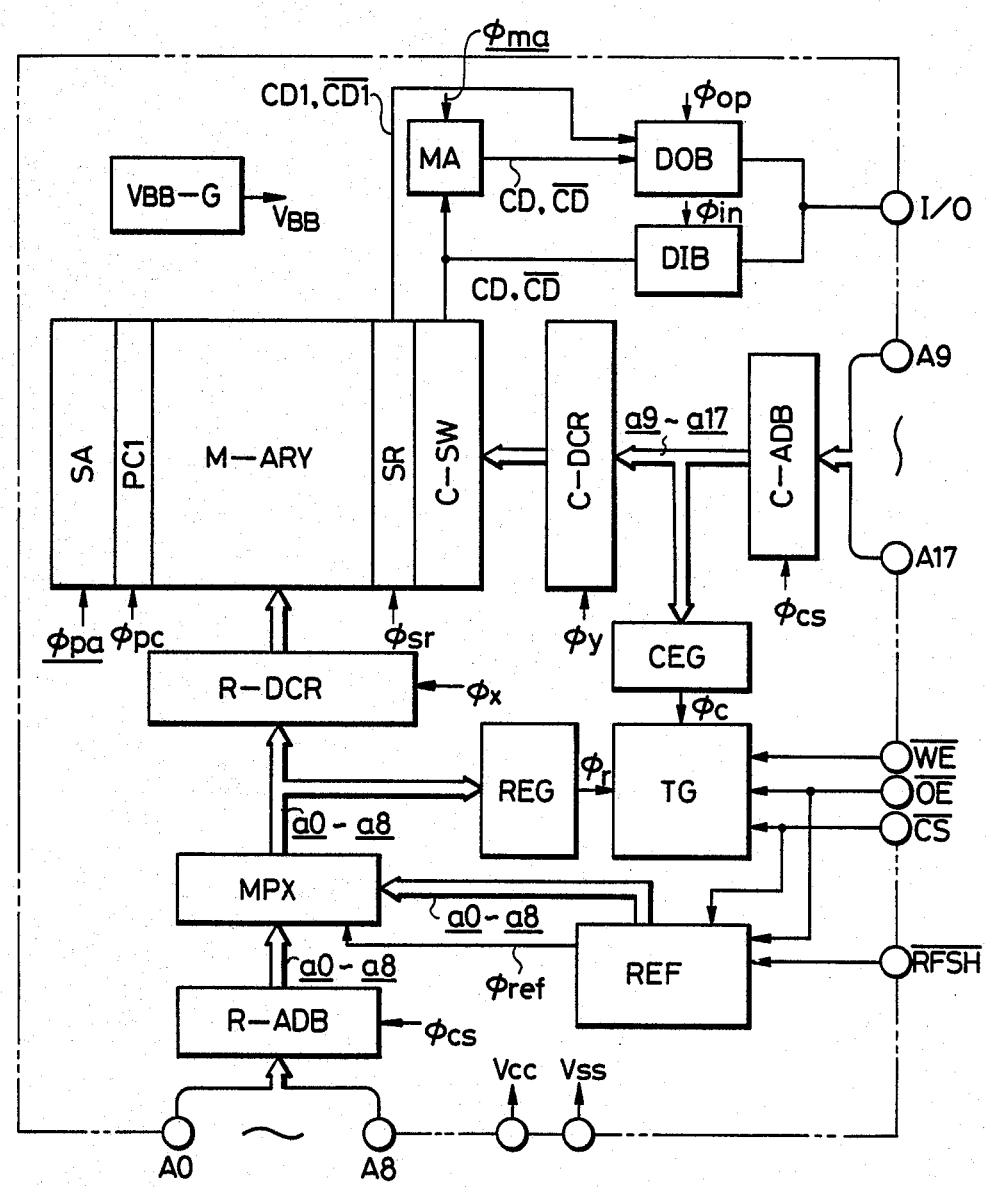
FIG. 1 is a block diagram showing one embodiment of the present invention.

FIG. 1 is a block diagram showing one embodiment of the present invention.

In the drawing, each circuit block encircled by dotted lines is formed on one semiconductor substrate such as single crystal silicon, though not limited to this construction, by known MOS integrated circuit production techniques. N-channel insulated gate field effect transistors (hereinafter referred to as "MOSFETs") constituting circuits which will be described later are formed in a P-type semiconductor substrate, and P-channel MOSFETs are formed in an N-type well region that is in turn formed in the surface of the semiconductor substrate. Thus, the semiconductor substrate constitutes a common substrate gate of the N-channel MOSFETs, while the N-type well region forms the common substrate gate of the P-channel MOSFETs. Though not limited to this arrangement, the substrate gate of the N-channel MOSFETs is kept at a negative potential, and that of the P-channel MOSFETs, at a power source voltage $V_{cc}$ level of the circuit.

Terminals I/O, A0–A17, $\overline{WE}$, $\overline{CS}$, $\overline{OE}$, $\overline{RFSH}$, Vcc and Vss are external terminals, and power is supplied from a suitable external power source, not shown, to the terminals Vcc and Vss.

As will become apparent from the following description, the semiconductor memory of this ebodiment constitutes a pseudo static memory, though the construction is not limited to this configuration. Each memory cell in this memory is formed by a dynamic type memory cell. The semiconductor memory includes address signal change detection circuits for detecting change of address signals, and a timing generation circuit for generating various timing signals upon receiving the detection output of the detection circuits. Thus, access can be made to the semiconductor memory also by changing the address signals alone.

In FIG. 1, the symbol M-ARY represents a memory array; the familiar 1-MOS memory cells consisting of a memory capacitor and an address selection MOSFET are arranged in a matrix. Though not limited to this configuration, the memory cell has a folded bit line construction in which its input/output node is connected to either one of a pair of complementary data lines D and $\overline{D}$ that are disposed in parallel with each other.

The symbol PC represents a data line precharge circuit. Though not limited to this method, the precharge operation of the memory array of this embodiment is executed by merely short-circuiting the pair of complementary data lines by MOSFET. This also holds true of the common complementary data lines which will be discussed later. In this instance, the precharge level of each complementary data line is equal to an intermediate level of about Vcc/2. This arrangement makes it possible to reduce the level change in comparison with the case where each complementary data line is charged up from 0 volt to the Vcc level. Since the transistor can be sufficiently turned on under the unsaturated state even by the use of an ordinary logic level (Vcc) as the gate voltage of the precharge MOSFET, it is possible to speed up the precharge operation and moreover, with the lower power consumption.

Since the precharge level is set to the intermediate level of about Vcc/2 as described above, the switching MOSFET of the memory cell can be sufficiently changed in the unsaturated state even when its gate voltage (word line section voltage) is at the ordinary logic level (Vcc) at the time of read-out of the memory cell. Therefore, the whole charge of the data storage capacitor can be read out without using a bootstrap voltage. The precharge level of one of the data lines for which the memory cell is not selected is used as a read-out reference voltage. This eliminates the necessity of a dummy cell for generating a read-out reference voltage.

The symbol SA represents a sense amplifier, which consists of a CMOS (complementary MOS) latch circuit including a pair of power switch MOSFETs consisting of P- and N-channel MOSFETs disposed at the power source voltage Vcc and the ground potential Vss of the circuit, respectively. Its pair of input/output nodes are connected to the complementary data lines D and $\overline{D}$, respectively. A timing pulse $\phi$pa controls the power switch MOSFETs. Here, both of non-inversion timing pulse $\phi$pa and inversion timing pulse $\overline{\phi}$pa are represented by $\phi$pa. The pair of power switch MOSFETs are turned on immediately before precharge, so that the complementary data liens D and $\overline{D}$ keep the Vcc and Vss levels in the floating state, respectively.

The symbol C-SW represents a column switch, which connects the complementary data line selected in accordance with a column selection signal to the common complementary data lines (represented by one line) CD, $\overline{CD}$.

The symbol R-ADB represents a row address buffer, which receives external address signals through the external terminals A0–A8 and generates internal complementary address signals a0–a8 and $\overline{a0}$–$\overline{a8}$ under control of the timing signal $\phi$cs. In the following description and drawings, a pair of internal complementary address signals such as a0 and $\overline{a0}$ will be represented by the internal complementary address signal a0. Therefore, the internal complementary address signals a0–a8 and $\overline{a0}$–$\overline{a8}$ will be represented as the internal complementary address signals a0–a8.

The symbol C-ADB represents a column address buffer, which receives external address signals through external terminals A9–A17, and generates internal complementary address signals a9–a17 and $\overline{a9}$–$\overline{a17}$ under the control of $\phi$cs. In the following description and drawings, these internal complementary address signals a9–17 and $\overline{a9}$–$\overline{a17}$ will be represented, in a manner similar to the aforementioned timing pulses and address signals, by internal complementary address signals a9–a17.

The symbol R-DCR represents a row address decoder, which receives the internal complementary address signals $\overline{a0}$–$\overline{a8}$ through the multiplexor MPX which will be discussed later, and generates word line selection signals for M-ARY. This word line selection signal is transmitted to M-ARY in synchronism with a word line selection timing signal $\phi$x.

The symbol MA represents a main amplifier, which has the same circuit construction as the sense amplifier SA described already. The timing pulse $\phi$ma controls its pair of power switch MOSFETs. The timing signal $\phi$ma consists of mutually complementary signals $\phi$ma and $\overline{\phi}$ma. A precharge circuit (not shown) which is equivalent to the precharge circuit PC1 is disposed on the common complementary the data lines on the input side of this main amplifier MA.

The symbol DOB represents a data output buffer, which delivers read-out data from the main amplifier MA to the external terminals I/O by means of the output timing pulse $\phi$op. Since the output timing pulse $\phi$op is at the low level during the write-in operation, this data output buffer is brought into the inoperative (output high impedance) state.

The symbol DIB represents a data input buffer, which delivers the write-in data from the external terminals I/O to the common complementary data lines by means of the input timing pulse $\phi$in. Since the input timing pulse $\phi$in is at the low level during the read-out operation, this buffer DIB is inoperative in the same way as the data output buffer DOB.

The various timing signals described above are generated by each of the following circuit blocks.

The symbol REG represents an address signal change detection circuit which receives the address signals a0–a8 (or $\overline{a0}$–$\overline{a8}$) and detects the change of the rise or fall of the signals, through the construction is not limited to this configuration. Symbol CEG represents an address signal change detection circuit, which receives address signals a9–a17 (or $\overline{a9}$–$\overline{a17}$), and detects the change of the rise or fall of the signals, though the circuit is not limited to this construction.

The address signal change detection circuit REG consists of exclusive-OR circuits receiving address signals a0–a8 and their delay signals, respectively, and a logical sum circuit receiving the output signals of the exclusive-or circuits, though the circuit is not limited to this construction. That is, each exclusive-OR circuit receiving the address signal and the delay signal of the address signal is disposed for each address signal. In this embodiment, nine exclusive-OR circuits are disposed, and the output signals of these nine exclusive-OR circuits are applied to the logical sum circuit. Therefore, when any of the address signals a0–a8 change, the address signal change detection circuit REG generates an address signal change detection pulse $\phi$r which is synchronized with its change timing.

The address signal change detection circuit CEG has the same circuit construction as the address signal change detection circuit REG. It consists of exclusive-OR circuits receiving the address signals a9–a17 and their delay signals, respectively, and a logical sum circuit receiving the output signals of these exclusive-OR circuits. This address signal change detection circuit CEG generates an address change detection pulse $\phi$c which is synchronized with the change timing when any of the address signals a9–a17 changes, in the same way as the address signal change detection circuit REG described above.

The symbol TG represents a timing generation circuit, which generates principal timing signals described already as the typical examples. Besides the address signal change detection pulses $\phi$r and $\phi$c, the timing generation circuit TG receives a write signal $\overline{WE}$, a chip selection signal $\overline{CS}$ and an output signal $\overline{OE}$ that are applied thereto, and generates a series of timing pulses such as those mentioned previously for the other circuit elements. Such timing generation circuits are well known, and construction of one such as TG could readily be accomplished using either commercially available circuitry or well known design principles for such timing generators. For example, U.S. Ser. No. 617,098 filed by Kanji Oishi on June 4, 1984, and assigned to the same assignee as the present case, is an example of timing generator structure for producing timing signals similar to those used in FIG. 1. This case is hereby incorporated by reference.

The symbol MPX represents a multiplexor, which selectively transmits the internal complementary address signals $\overline{a0}$–$\overline{a8}$ generated by the address buffer R-ADB and the internal complementary address signals $\overline{a0}$–$\overline{a8}$ generated by the automatic refresh circuit REF which will be described later, to the decoder R-DCR, in accordance with a control signal (not shown) from the automatic refresh signal REF which will be described later.

The symbol $V_{BB}$-G represents a substrate bias voltage generation circuit, which receives a positive power source voltage and generates a negative bias voltage to be supplied to the substrate gates of the N-channel MOSFETs.

The symbol REF represents the automatic refresh circuit described above. As will be described later, this circuit includes a refresh address, counter, a timer, and so forth, and is actuated when a refresh signal $\overline{RFSH}$ from the external terminal falls to the low level. When the refresh signal $\overline{RFSH}$ falls to the low level during the high level period of the chip selection signal $\overline{CS}$, the automatic refresh circuit REF supplies to the multiplexor MPX a control signal $\phi$ref for selecting the internal address signals from the refresh counter incorporated therein, in response to the fall of the refresh signal to the low level. Thus, the internal address signal produced from the refresh address counter is applied to the address signal change detection circuit REG and to the row decoder R-DCR through the multiplexor MPX. The address signal change detection circuit REG produces the detection pulse $\phi$r when the internal address signal applied thereto changes. Upon receiving the detection pulse $\phi$r, the timing generation circuit TG produces various timing signals. A plurality of memory cells connected to one word line that is designated by the refresh address counter are therefore refreshed.

When the refresh signal $\overline{RFSH}$ is kept at the low level, the refresh address counter advances with a predetermined interval of time due to the timer operation. Therefore, the refresh operation (self-refresh) is carried out continuously.

This embodiment makes it possible to carry out a continuous read-out operation by utilizing the refresh operation (the word line selection operation) of this automatic refresh circuit REF. The memory array M-ARY is equipped with a shift register SR to which the read-out signals of the complementary data lines are applied in parallel. The automatic refresh circuit REF is equipped with an oscillation circuit which generates the shift clock $\phi$sr (as well as signals $\overline{\phi}$sr and $\phi$srl) for the shift register SR described above in a manner which will be discussed in detail later.

Figure 2:
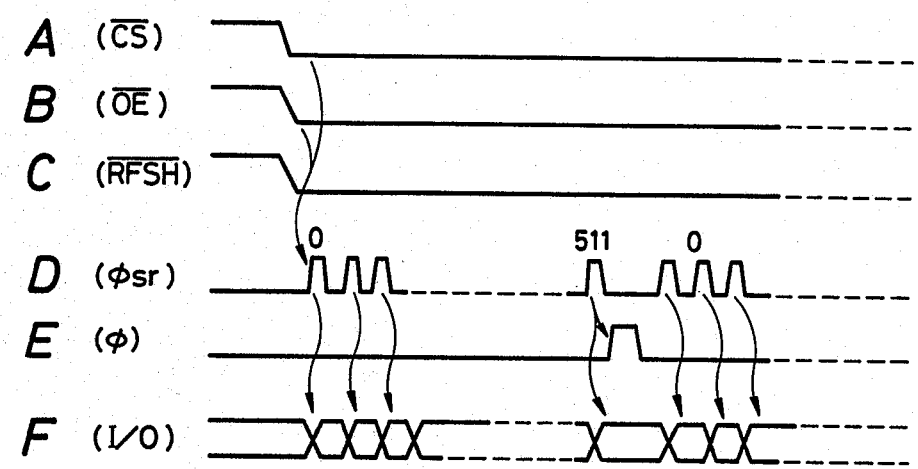
FIGS. 2a to 2f show a timing chart useful for explaining the operation of the circuit shown in FIG. 1.

Next, the continuous read-out operation of this embodiment will be described with reference to the timing chart of FIG. 2.

When the chip selection signal $\overline{CS}$, the output enable signal $\overline{OE}$ and the refresh signal $\overline{RFSH}$ are changed to the low levels as shown in FIGS. 2A to 2C respectively, the address counter circuit disposed in the automatic refresh circuit REF is once reset, and the multiplexor MPX is set to the side of the automatic refresh circuit REF. In this instance, the word line selection operation is carried out by the address signal generated by the address counter circuit. The signal read out to each complementary data line is taken in parallel into the shift register SR. Since the shift operation of the shift register SR is effected by the shift clock $\phi$sr generated by the oscillation circuit described above, 512-bit data, 0 through 511, is serially delivered through the data output buffer DOB. When this operation is completed, the built-in timer circuit (within REF as shown, for example, in FIGS. 8 and 9) generates an advance pulse $\phi$ for the address counter circuit, and the address signal is changed to +1, thereby effecting the next word line selection operation. Thereafter, the shift operation of the shift register SR and the advancing operation of the address counter circuit are repeated in the same way, thereby making it possible to read out continuously all the bits without supplying the address signals from outside.

When the chip selection signal $\overline{CS}$ and the refresh signal $\overline{RFSH}$ are at the high level ($\overline{OE}$ is irrelevant), a chip non-selection state (or the stand-by situation) is established. The refresh operation is effected when the chip selection signal $\overline{CS}$ is at the high level and when the refresh signal $\overline{RFSH}$ is at the low level ($\overline{OE}$ is irrelevant), so that the continuous read-out operation can be distinguished from the other operation modes by the combination of the external control signals.

Figure 3:
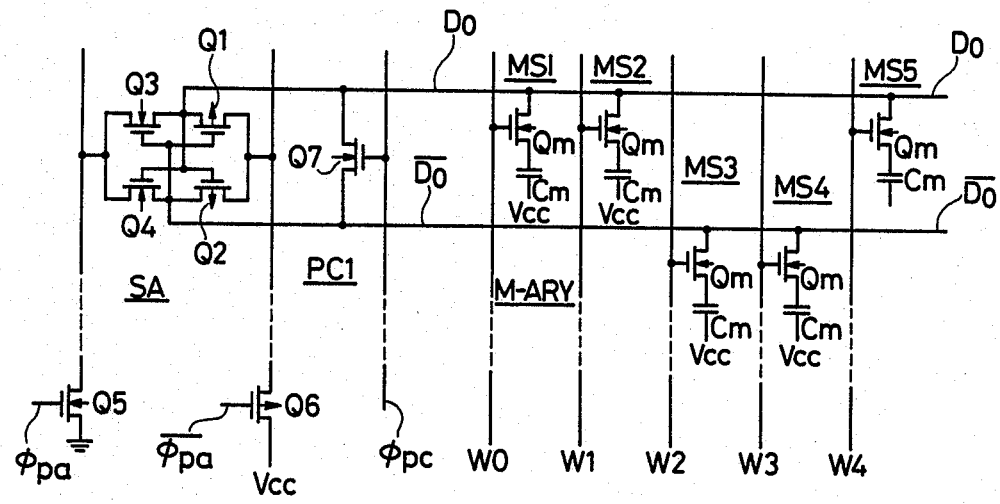
FIG. 3 is a circuit diagram of a sense amplifier and a memory array.

FIG. 3 shows a circuit diagram of the sense amplifier SA, the precharge circuit PC1 and the memory array M-ARY.

The memory array M-ARY is constructed with a plurality of pairs of data lines, a plurality of word lines and a plurality of memory cells. In the drawing, however, only one pair of data lines Do, $\overline{Do}$ and the memory cells MS1 through MS5 connected to these data lines are shown disposed in order to simplify illustration. Each of the memory cells MS1–MS5 is constructed with a switching MOSFET $Q_m$ and a data storage capacitor $C_m$. The gate of the switching MOSFET $Q_m$ as the selection terminal of the memory cell is connected to one of the corresponding word lines Wo–W4, and its current carrying electrode as the data input/output terminal of the memory cell is connected to one of the data lines Do and $\overline{Do}$. One of the plates of each capacitor $C_m$ is connected to the power source $V_{cc}$.

The sense amplifier SA comprises a CMOS latch circuit which in turn comprises P-channel MOSFETs $Q_1$ and $Q_2$ and N-channel MOSFETs $Q_3$ and $Q_4$ as shown in the drawing. A P-channel MOSFET $Q_6$ which is subjected to switching control by the timing signal $\overline{\phi}$pa is interposed between the CMOS latch circuit and the power terminal $V_{cc}$, and an N-channel MOSFET $Q_5$ is interposed between the CMOS latch circuit and the ground potential point (0 volt) of the circuit. This N-channel MOSFET $Q_5$ is subjected to switching control by the timing signal $\phi$pa.

The precharge circuit PC1 consists of an N-channel MOSFET $Q_7$ that is interposed between a pair of data lines Do and $\overline{Do}$.

Figure 4:
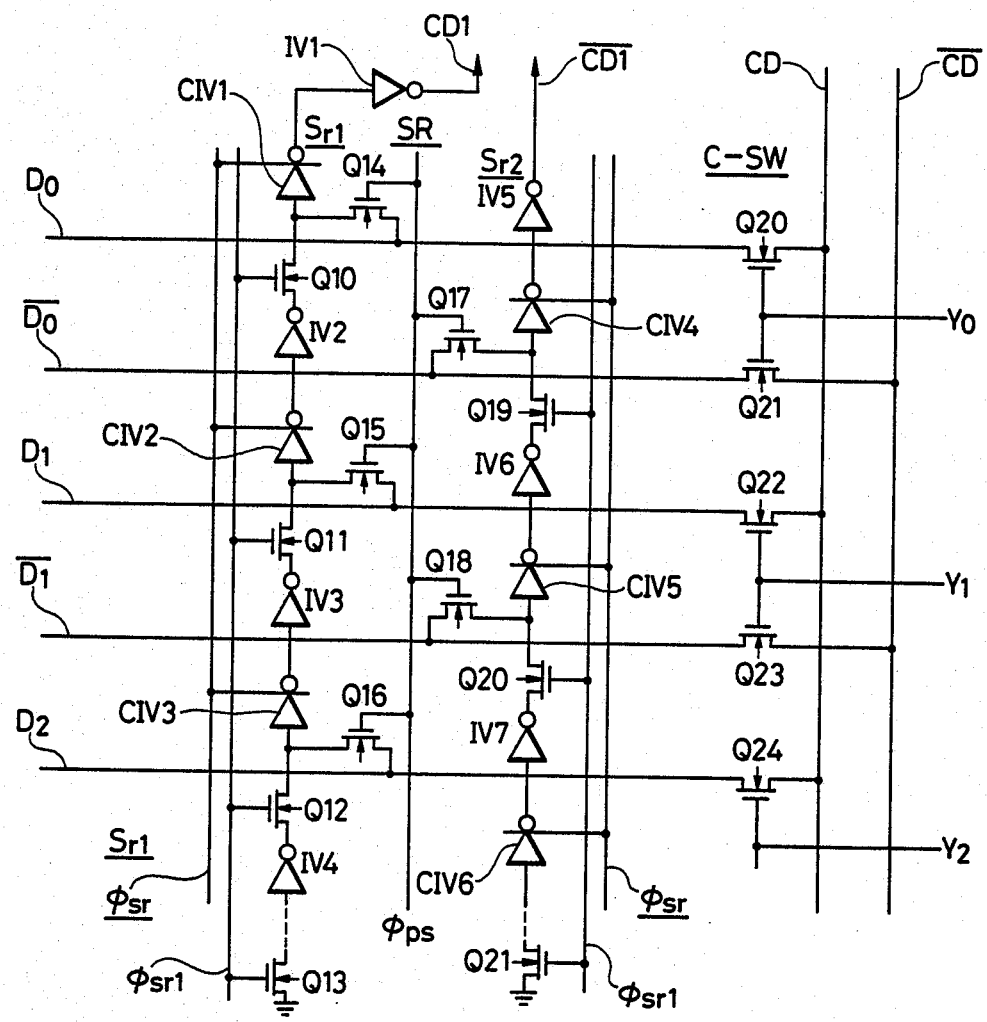
FIG. 4 is a circuit diagram of a shift register and a column switch circuit.

FIG. 4 is a circuit diagram of the shift register SR and the column switch C-SW.

The shift register SR in this embodiment is constructed with first and second shift registers $Sr_1$ and $Sr_2$ in order to obtain complementary output signals CD1 and $\overline{CD1}$ which change at the same timing, though the embodiment is not limited to this construction.

The first shift register $Sr_1$ is arranged in such a fashion as to receive the data from one side of data lines $D_o$, $D_1$, $D_2$ among a plurality of pairs of data lines $D_o$, $\overline{D_o}$, $D_1$, $\overline{D_1}$, $D_2$.

The second shift register $Sr_2$ is arranged in such a fashion as to receive the data from the other side of the data lines $\overline{D_o}$, $\overline{D_1}$ of the plurality of data line pairs.

The operations of the first and second shift registers are controlled by the presetting signal $\phi$ps and the timing signals $\phi$sr, $\overline{\phi}$sr and $\phi$srl.

The presetting signal $\phi$ps is raised to the high level for a predetermined period of time at the timing at which the data signal applied to the pair of data lines is amplified by the sense amplifier SA, though it is not limited to this arrangement.

The timing signal $\phi sr$ is raised periodically to the high level after the operation of the sense amplifier SA if the refresh control signal $\overline{RFSH}$ and the chip selection signal $\overline{CS}$ are at the low level. The timing signal $\overline{\phi}sr$ is a signal which has the opposite phase to the timing signal $\phi sr$. The timing signal $\phi sr1$ is a signal having substantially the same phase as the timing signal $\phi sr$. In FIG. 4, the illustrated signal $\underline{\phi sr}$ consists of the mutually complementary signals $\phi sr$ and $\overline{\phi}sr$.

The first and second shift registers have the same construction. Therefore, the construction and operation of only the first shift register Sr1 will be described in detail but those of the second shift register Sr2 will be omitted.

The first shift register Sr1 is constructed with a plurality of unit shift stages each of which corresponds one by one to the data lines $D_o$, $D_1$, $D_2$ of the memory array, and an additional unit shift stage. Each unit shift stage cascades to the other stages.

The final unit shift stage corresponding to the first data line $D_o$ is constructed with a CMOS inverter IV1, a CMOS clocked inverter CIV1, a transfer MOSFET $Q_{14}$ interposed between the data line $D_0$ and the input node of the clocked inverter CIV1 and a transfer MOSFET Q10 interposed between the input node of the clocked inverter CIV1 and the output node of the unit shift stage of a preceding stage. The unit shift stage of the preceding stage corresponding to the second data line $D_1$ is constructed with a half bit shift stage consisting, in turn, of a CMOS inverter IV2 and a CMOS clocked inverter CIV2 that are connected in series with each other, a half bit stage consisting of a transfer MOSFET Q11 and preset means consisting of a transfer MOSFET Q15. Similarly, the unit shift stage corresponding to the third data line $D_2$ consists of two half bit shift stages and preset means.

In this embodiment, the additional unit shift stage is disposed in order to detect completion of the shift operation. The additional unit shift stage has the same construction as the unit shift stage described above, and its output node is connected to the input node of the unit shift stage of the initial stage (not shown) that corresponds to the 512th data line $D_{511}$ (not shown). Though not limited to this arrangement, the input node of the addition unit shift stage, that is, one current carrying electrode of MOSFET Q13 shown in FIG. 4, is kept at the ground potential of the circuit.

Figure 5:
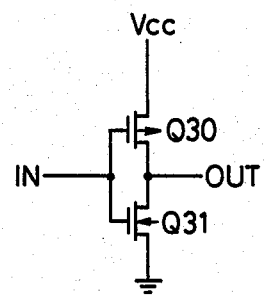
FIG. 5 is a circuit diagram of a CMOS inverter.
Figure 6:
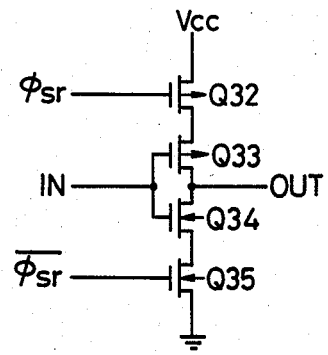
FIG. 6 is a circuit diagram of a CMOS clocked inverter.

Each inverter and each clocked inverter in the first shift register Sr1 has the constructions such as shown in FIGS. 5 and 6, respectively.

Each inverter is constructed with a P-channel MOSFET Q30 and an N-channel MOSFET Q31 as shown in FIG. 5.

The clocked inverter is constructed with P-channel MOSFETs Q32, Q33 and N-channel MOSFETs Q34, Q35. It is brought into the active state when the timing signals $\phi sr$ and $\overline{\phi}sr$ are at the low and high levels, respectively, in response thereto, and produces a signal having an inverted level to the level of the signal applied to its input node IN, from its output node OUT. When the timing signals $\phi sr$ and $\overline{\phi}sr$ are at the high and low levels, respectively, the clocked inverter is brought into the inactive state. In this case, the level of the output node OUT is kept at the previous level by the stray capacitance (not shown) that exists at the output node OUT.

The first shift register operates in the following manner.

First of all, when the data signal applied between each pair of data lines is amplified, the preset signal $\phi ps$ is raised to the high level for a predetermined period of time. Therefore, the transfer MOSFETs Q14 through Q16 are turned on, and the data of the data lines $D_o$, $D_1$ and $D_2$ are applied to the input nodes of the corresponding clocked inverters CIV1, CIV2 and CIV3, respectively. In this case, these inverters are in the active state. Therefore, the data of the data line $D_o$ is transferred to the output terminal of the inverter IV1 through the transfer MOSFET Q14 through the clocked inverter CIV1 and through the inverter IV1. Similarly, the data of the data lines $D_1$ and $D_2$ are transferred to the output terminals of the inverters IV2 and IV3.

Next, when the timing signals $\phi sr$ and $\overline{\phi}sr$ are at the high and low levels, respectively, the clocked inverters CIV1 through CIV3 are brought into the inactive state. Since the timing signal $\phi sr1$ is raised to the high level in synchronism with the timing signal $\phi sr$, the transfer MOSFETs Q10 through Q13 are kept ON. As a result, the data of the data line $D_1$ that has been transferred in advance to the output terminal of the inverter IV2 is transferred to the input node of the clocked inverter CIV1 through MOSFET Q10. Similarly, the data signal of the data line $D_2$ is transferred to the input node of the clocked inverter CIV2 through MOSFET Q11. The data signal of the data line $D_3$, not shown, is transferred to the input node of the clocked inverter CIV3 through MOSFET Q12.

The signal level applied to the additional unit shift stage, not shown, that is, the 0 V low level, is transferred to the input node of the clocked inverter in the unit shift stage of the initial stage.

Next, when the timing signals $\phi sr$, $\overline{\phi}sr$ and $\phi sr1$ again change to the low, high and low levels, respectively, the clocked inverters CIV1 through CIV3 are brought into the active state, and the transfer MOSFETs Q10 through Q13 are turned OFF. The data of the data line $D_1$ is transferred to the output node of the inverter IV1 in response thereto. Similarly, the data signals of the data lines $D_2$ and $D_3$ are transferred to the output nodes of the inverters VI2 and IV3, respectively.

The same operations are thereafter repeated. As a result, the data signals of the data lines are sequentially produced from the output of the final stage circuit of the first shift register Sr1, that is, from the output node of the inverter IV1. The output of the final stage circuit drops to the low level in accordance with the input level (the low level) of the additional unit shift stage when the shift operation of the data signal is completed.

The second shift register Sr2 has an additional unit shift stage connected to the unit shift stage of the initial stage, in the same way as the first shift register Sr1. The current carry electrode of MOSFET Q21 in this additional unit shift stage is kept at the ground potential of the circuit in the same way as that of MOSFET Q13. The second shift register Sr2 is operated by the timing signals $\phi sr$, $\overline{\phi}sr$ and $\phi sr1$ that are the same as those supplied to the first shift register Sr1.

The data signals applied to the data lines $\overline{D_o}$, $\overline{D_1}$, $\overline{D_2}$ when the amplifier SA is operated have the phases that are opposite to those of the data signals applied to the data lines $D_o$, $D_1$ and $D_2$.

Therefore, the first and second shift registers Sr1 and Sr2 produce the complementary signals CD1 and $\overline{CD1}$, respectively.

Since the first and second shift registers of this embodiment are equipped with the additional unit shift stages, respectively, the output signals CD1 and $\overline{CD1}$ after the data signals reset to these shift registers are shifted out are not at the complementary levels but are at the low level. Therefore, the completion of shift of the preset data can be detected by detecting the point of time at which the output signals CD1 and $\overline{CD1}$ are no longer at the complementary levels.

In FIG. 4, the column switch C-SW is comprised of MOSFETs Q20 through Q24 that are interposed between each data line and the common complementary data lines CD and $\overline{CD}$. MOSFETs Q20 and Q21 connected to the data lines Do and $\overline{Do}$ are subjected to switching control by the column selection signal Y0 produced from the column decoder C-DCR shown in FIG. 1. Similarly, MOSFETs Q22, Q23 and Q24 are subjected to switching control by the column selection signals Y1 and Y2, respectively.

Figure 7:
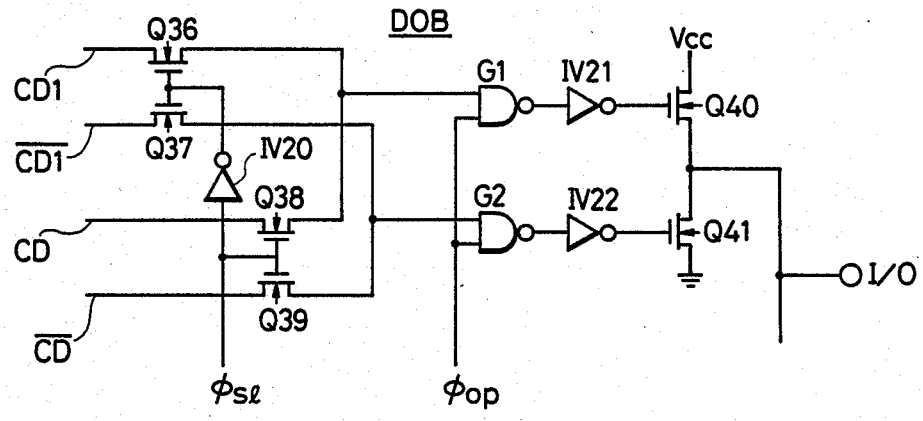
FIG. 7 is a circuit diagram of a data output buffer circuit.

FIG. 7 is a circuit diagram of the data output buffer DOB.

As shown in this drawing, the data output buffer DOB is constructed with transfer MOSFETs Q36 through Q39, CMOS inverters IV20 through IV22, CMOS NAND circuits G1 and G2, and N-channel outputs MOSFETs Q40 and Q41.

The timing signal $\phi$sl applied to this circuit (which timing signal $\phi$sl is generated by control circuit CNC) drops to the low level only when both the chip selection signal $\overline{Cs}$ and the refresh control signal $\overline{RFSH}$ are at the low level, that is, when the continuous serial output of the memory data is designated to memory, and it rises to the high level at the other times.

Therefore, the complementary signals CD1 and $\overline{CD1}$ produced from the shift register shown in FIGS. 1 and 4 are applied to the NAND circuits G1 and G2 through the transfer MOSFETs Q36 and Q37 if the timing signal $\phi$sl is at the low level.

When an ordinary memory operation is requested by the external control signals ($\overline{Cs}$: low level, $\overline{RFSH}$ high level), MOSFETs Q38 and Q39 are turned ON by the timing signal $\phi$sl, and the complementary signals of the common complementary data lines CD and $\overline{CD}$ are supplied to the NAND circuits G1 and G2.

The operation of the data output buffer DOB is controlled by the timing signal $\phi$op. It becomes inoperative when the timing signal $\phi$op is at the low level. In this case, the output MOSFETs Q40 and Q41 are turned OFF, and the data output buffer DOB is in the high output impedance state.

When the timing signal $\phi$op is raised to the high level, the data output buffer DOB becomes operative, and produces a high or low level output signal.

Figure 8:
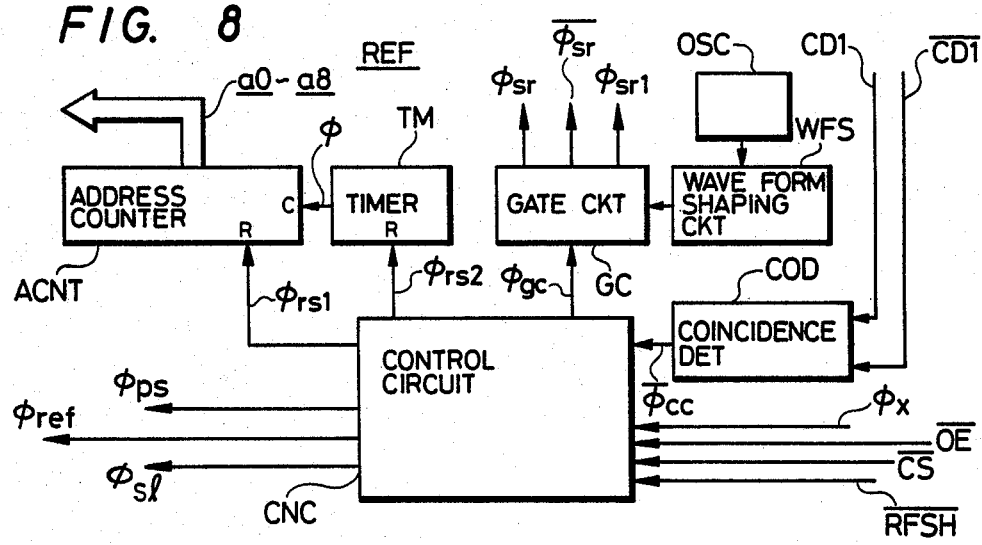
FIG. 8 is a block diagram of an automatic refresh circuit.

FIG. 8 is a schematic circuit diagram of the automatic refresh circuit REF.

The automatic refresh circuit is constructed with an address counter ACNT, a timer circuit TM, an oscillation circuit OSC, a waveform shaping circuit WFS, a gate circuit GC, a control circuit CNC and a coincidence detection circuit COD, though this circuit is not limited to this construction.

The address counter ACNT is constructed with nine binary counters (not shown) for generating 9-bit internal address signals a0 through a8, that are connected in series, and count advance pulses $\phi$ supplied from the timer circuit TM. The address counter ACNT is reset by a reset signal $\phi$rs1 supplied from the control circuit CNC.

The oscillation circuit OSC generates a pulse signal of a reference period. Though not shown in detail, the oscillation circuit OSC comprises a ring oscillation circuit consisting of a plurality of inverters that are connected in the ring form, for example.

The operation of the timer circuit TM is controlled by the control signal $\phi$rs2 supplied from the control circuit CNC, and the timer circuit TM produces the advance pulse $\phi$ during operation.

The waveform shaping circuit WFS receives the output of the oscillation circuit OSC, and generates pulse signals having a phase which is substantially the same as the control signals $\phi$sr, $\overline{\phi sr}$ to be produced from the gate circuit GC.

The operation of this gate circuit GC is controlled by the control signal $\phi$gc supplied from the control circuit CNC. The gate circuit GC transfers the pulse signals of the waveform shaping circuit WFS to its output terminals during its operation.

The coincidence detection circuit COD receives the output signals CD1 and $\overline{CD1}$ of the shift register SR shown in FIG. 4, and produces a detection pulse $\overline{\phi cc}$ when the signal levels of these output signals coincide with each other. The coincidence detection circuit can be composed of a two-input CMOS NAND circuit, for example.

The control circuit CNC receives the output enable signal, the chip selection signal and the refresh control signal through the external terminals $\overline{OE}$, $\overline{CS}$ and $\overline{RFSH}$, and receives also the detection pulse $\overline{\phi cc}$ described above and the word line selection timing signal $\phi$x generated from the timing generation circuit TG shown in FIG. 1 to produce various control signals.

The control signal $\phi$ref is formed on the basis of the refresh control signal $\overline{RFSH}$, and has the opposite phase to the refresh control signal $\overline{RFSH}$, though it is not limited to this arrangement.

The multiplexor MPX shown in FIG. 1 selects the output of the address counter ACNT when the refresh control signal $\overline{RFSH}$ is at the low level in order to execute the auto refresh operation and the continuous read-out operation of the data signal.

When all of the external control signals $\overline{OE}$, $\overline{CS}$ and $\overline{RFSH}$ are at the low level, that is, when the continuous read-out operation of the data is requested to the memory, the control signal $\phi$rs1 is raised to the high level for a predetermined period of time. In this instance, the address counter ACNT is reset to the state of the count value 0.

The control signal $\phi$rs2 is set to the low level when the external control signals $\overline{CS}$ and $\overline{RRSH}$ are at the high and low levels, respectively. It is raised to the high level when the external control signal $\overline{RFSH}$ is at the high level. When the control signal $\phi$rs2 is at the low level, the timer circuit TM is brought into the active state and produces the advance pulse $\phi$ of a predetermined period.

The control signal $\phi$rs2 is raised to the high level when all of the external control signals $\overline{CS}$, $\overline{OE}$ and $\overline{RFSH}$ are at the low level, and is set to the low level for a predetermined period of time from the point of time when the coincidence detection pulse $\overline{\phi cc}$ is produced while the external control signals $\overline{CS}$, $\overline{OE}$ and $\overline{RFSH}$ are at the low level. Thus, one advance pulse $\phi$ is produced from the timer circuit TM. As will become more apparent from further description, the delay time from the generation of the coincidence detection pulse $\overline{\phi cc}$ till the generation of the control signal $\phi rs2$ is substantially equal to the retrace time necessary for driving a CRT display.

The presetting signal $\phi ps$ is raised to the high level for a predetermined period after the sense amplifier SA is operated, though it is not limited to this arrangement. In this embodiment, the preset signal $\phi ps$ is raised to the high level after the passage of a predetermined delay time from the point of time when the word line selection timing signal $\phi x$ is raised to the high level. The preset signal $\phi ps$ may be set to the high level after the sense amplifier control signal $\phi pa$ has been produced.

The gate control signal $\phi gc$ is also raised to the high level in synchronism with the generation of the word line selection timing signal $\phi x$ after all of the external control signals $\overline{CS}$, $\overline{OE}$ and $\overline{RFSH}$ have dropped to the low level, though not limited. With this arrangement, the gate control signal $\phi gc$ i set to the low level in order to inhibit the generation of the shift control signals $\phi sr$, $\overline{\phi sr}$ and $\phi sr1$ when the control signal $\phi rs2$ is at the high level.

The circuit operation of the memory brought forth by the automatic refresh circuit RFE shown in FIG. 8 is as described above.

Thus, when the chip selection signal $\overline{CS}$ is at the chip non-selection level (the high level) and the refresh control signal $\overline{RFSH}$ are at the low level, the control signal $\phi ref$ is raised to the high level in response to the former, and the address signals a0 through a8 of the row system of the address counter $\overline{ACNT}$ are selected by the multiplexor MPX (shown in FIG. 1). The address signal change detection circuit REG (see FIG. 1) detects the change of the internal address signal produced from the multiplexer MPX. Upon receiving the detection pulse $\phi r$, the timing generation circuit TG (see FIG. 1) produces various control signals in order to operate the row system circuit.

The word line selection timing signal $\phi x$ is temporarily changed to the non-selection level (the low level), so that one word line, that has been selected in advance in the previous operation cycle, is temporarily changed to the non-selection level together with the other non-selected word lines.

The sense amplifier control signal $\phi pa$ is set to the level that renders the sense amplifier SA (FIGS. 1 and 3) inoperative, in synchronism with the timing at which the timing signal $\phi x$ is changed to the low level.

The control signal $\phi pc$ is raised to the high level for a predetermined period of time after the word line is set to the non-selection level, so that the precharge circuit PC1 (FIGS. 1 and 3) is operated and each data line in the memory array M-ARY is precharged to a precharge level of about Vcc/2.

The word line selection timing signal $\phi x$ is raised to the high level after the control signal $\phi pc$ is set to the low level. Then, the row decoder R-DCR sets the word line corresponding to the internal address signal a0–a8 to the selection level.

The sense amplifier control signal $\phi pa$ is set to the level for operating the sense amplifier SA after the word line selection timing signal $\phi x$ is set to the high level. Therefore, the data signals applied from the memory cells to the data lines are amplified by the sense amplifier SA. The amplifier data signals are rewritten into the memory cells. In other words a refresh operation is conducted.

When the chip selection signal $\overline{CS}$ and the refresh control signal $\overline{RFSH}$ are at the high and low levels, respectively, the control signals $\phi rs1$ and $\phi rs2$ are kept at the low level. In this case, the address counter ACNT and the timer circuit TM are kept in the active state.

Therefore, the advance pulse $\phi$ is produced from the timer circuit TM, and the address counter CNT is incremented by 1. The word line having the updated address is then selected, and the refresh operation of the memory cells belonging to that word line is executed.

When the chip selection signal $\overline{CS}$ is at the non-selection level, the timing generation circuit TG does not produce the control signals that operate the column system circuit.

Next, the circuit operation when the continuous read-out operation is instructed will be explained.

When all the external control signals $\overline{CS}$, $\overline{OE}$ and $\overline{RFSH}$ are changed to the low level, the control signal $\phi sr1$ is set to the high level for a predetermined period in response to the former. Therefore, the address counter ACNT is set to the count valve 0. In other words, the count in the address counter ACNT is changed to a value which causes instructions to be sent to the first word line.

The output of the address counter ACNT is applied to the address signal change detection circuit REG through the multiplexor MPX; hence, the detection pulse $\phi r$ is produced. The timing generation circuit TG produces the control signals in response to the detection pulse $\phi r$, and the row address decoder R-DCR, the sense amplifier SA and the precharge circuit PC1 are operated at the same timing as described above.

When the data signal applied to each data line of the memory array M-ARY is amplified by the sense amplifier SA, the preset signal $\phi ps$ is raised to the the high level for a predetermined period. Therefore, each of the data signals applied to each data line is preset to the shift register SR (see FIGS. 1 and 2).

The gate control signal $\phi gc$ is raised to the high level in synchronism with the timing at which the preset signal $\phi ps$ is set to the low level. Therefore, the gate circuit GC is opened, and produces the shift control signals $\phi sr$, $\overline{\phi sr}$ and $\phi sr1$. Since these control signals $\phi sr$, $\overline{\phi sr}$ and $\phi sr1$ are produced, the data signals that have been preset to the shift register SR are continuously produced therefrom.

When all the data signals read out from the memory cells belonging to the first word line are produced, the two outputs CD1 and $\overline{CD1}$ of the shift register SR are set to the low level. When these outputs CD1 and $\overline{CD1}$ are set to the same level, the coincidence detection circuit COD produces the coincidence detection pulse $\overline{\phi cc}$.

The gate control signal $\phi gc$ is set to the low level in response to the output of the coincidence detection pulse $\overline{\phi cc}$, and the gate circuit GC is closed.

After a predetermined period has passed from the generation of the coincidence detection pulse $\overline{\phi cc}$, the control signal $\phi rs2$ is set to the low level, so that the timer circuit TM becomes operative and produces the advance pulse $\phi$. Since this advance pulse $\phi$ is produced, the address counter ACNT is incremented by one. Thus, the count changes from 0 to 1.

The row system circuit starts again operating when the output of the address counter ACNT changes.

The preset signal $\phi ps$ and the gate control signal $\phi gc$ are again produced in response to the word line selection timing signal $\phi x$. Therefore, the data signals read out from the memory cells belonging to the second word line are continuously read out, repeating thereafter the same operation.

Figure 9:
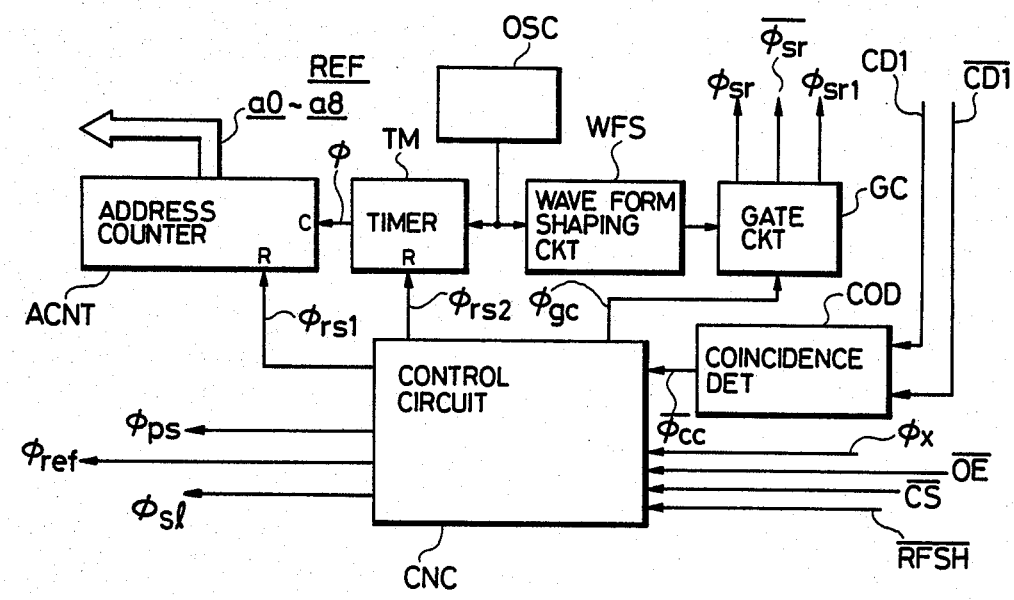
FIG. 9 is a circuit diagram of an automatic refresh circuit in accordance with another embodiment of the present invention.

FIG. 9 is a block diagram of an automatic refresh circuit in accordance with another embodiment of the present invention.

In this embodiment, a refresh operation is carried out in a relatively short period during the continuous data read-out operation. Therefore, the refresh operation becomes possible in this embodiment even when the speed of continuous data read-out operation is low.

The automatic refresh circuit REF is constructed with an address counter ACNT, a timer circuit TM, an oscillation circuit OSC, a waveform shaping circuit WFS, a gate circuit GC, a control circuit CNC and a coincidence detection circuit COD, though this circuit is not limited to this construction.

The address counter ACNT, the oscillation circuit OSC, the waveform shaping circuit WFS, the gate circuit GC and the coincidence detection circuit COD have the same constructions as those shown in FIG. 8, respectively.

The timer circuit TM receives the output of the oscillation circuit OSC, and its operation is controlled by the control signal $\phi rs2$ applied from the control circuit CNC.

The timer circuit TM generates the advance pulse $\phi$ having the same period as the period of the pulse signals that are generated from the waveform shaping circuit WFS when the control signal $\phi rs2$ is in the active low level state. If the control signal $\phi rs2$ is at the high level, the timer does not generate the advance pulse $\phi$.

Upon receiving the external control signals $\overline{CS}$, $\overline{OE}$, $\overline{RFSH}$, the detection pulse $\overline{\phi cc}$ and the word line selection timing signal $\phi x$, the control circuit CNC produces various control signals.

The control signal $\phi ref$ is generated on the basis of the refresh control signal $\overline{RFSH}$ in the same way as the control signal shown in FIG. 8.

When all of the control signals $\overline{CS}$, $\overline{OE}$ and $\overline{RFSH}$ are changed to the low level, the control signal $\phi rs1$ is raised to the high level for a predetermined period in the same way as the control signal shown in FIG. 8. Therefore, the address counter ACNT is reset to the count valve 0.

When the external control signals $\overline{CS}$ and $\overline{RFSH}$ are kept at the high and low levels, respectively, the control signal $\phi rs2$ is kept at the low level in the same way as the control signal in the foregoing embodiment. Unlike the control signal $\phi rs2$ in the foregoing embodiment, however, this control signal $\phi rs2$ is raised to the high level for a predetermined period from the point of the time when the coincidence detection pulse $\phi cc$ is produced in response to the low level state of all the external control signals $\overline{CS}$, $\overline{OS}$ and $\overline{RFSH}$.

In response to the high level state of the control signal $\phi rs2$, the timer circuit TM is brought into the inoperative state for a predetermined period from the generation of the coincidence detection pulse $\overline{\phi cc}$, in the opposite way to the foregoing embodiment. The period of the inoperative state of the timer circuit TM when the external control signals $\overline{CS}$, $\overline{OE}$ and $\overline{RFSH}$ are at the low level is corresponded with the retrace period necessary for a CRT display.

The presetting signal $\phi ps$ is raised to the high level for a predetermined period when all the external control signals $\overline{CS}$, $\overline{OE}$ and $\overline{RFSH}$ are at the low level. When the detection pulse $\phi cc$ is produced, the preset signal $\phi ps$ is raised also to the high level for a predetermined period after the control signal $\phi rs2$ falls to the low level. The timing at which the preset signal $\phi ps$ is raised to the high level is controlled by the word line selection timing signal $\phi x$ in the same way as in the foregoing embodiment.

The gate control signal $\phi gc$ is raised to the high level in synchronism with the timing at which the preset signal $\phi ps$ is set to the low level. The gate signal $\phi gc$ is kept a the high level until the coincidence pulse $\overline{\phi cc}$ is generated.

The automatic refresh operation ($\overline{CS}$: high level, $\overline{RFSH}$: low level) when the circuit of this embodiment is used is the same as in the foregoing embodiment.

The circuit operation when a data continuous read-out operation is requested is as follows.

Thus, when all the external control signals $\overline{CS}$, $\overline{OE}$ and $\overline{RFSH}$ are changed to the low level, the control signal $\phi rs1$ is raised to the high level for a predetermined period, and the count number of the address counter ACNT is reset to 0.

The timing generation circuit TG shown in FIG. 1 generates various control signals in response to the change of the output of the address counter ACNT. Therefore, the row address decoder R-DCR, the sense amplifier SA and the precharge circuit PC1 are operated at the same timing as in the foregoing embodiment.

The presetting signal $\phi ps$ is raised to the high level for a predetermined period after the sense amplifier SA is operated, so that the data signals of the memory cells connected to the first word line are preset to the shift register SR shown in FIG. 4.

The gate control signal $\phi gc$ is raised to the high level in synchronism with the change timing of the preset signal $\phi pc$ to the low level, so that the gate circuit GC is opened.

The data signals of the first data lines Do, $\overline{Do}$ are generated from the shift register SR in response to the first shift control signals $\phi sr$ and $\overline{\phi sr}$. The output signals from the shift register SR are applied to the external terminal I/O through the data output buffer DOB.

Similarly, the data signals of the second and third data lines D1, $\overline{D1}$ and D2, $\overline{D2}$ are sequentially generated at the external terminal I/O through the shift register SR and the data output buffer DOB in response to the second and third shift control signals, respectively.

The timer circuit TM generates the advance pulse $\phi$ in synchronism with the output of the shift control signal. Therefore, the address counter ACNT is repeatedly incremented by one in synchronism with the shift operation of the shift register SR. The row system circuits are sequentially operated in response to the change of the count in the address counter ACNT. As a result, a plurality of word lines are sequentially selected, and the refresh operation of the memory cells connected to the respective word lines is executed.

In this case, the coincidence detection pulse $\overline{\phi cc}$ is not produced unless all the data signals preset to the shift register SR are shifted out. Therefore, the preset signal $\phi ps$ is kept at the low level.

After the preset data signal corresponding to the 512th data line is produced from the shift register SR, the shift control signals $\phi sr$, $\overline{\phi sr}$ and $\overline{\phi sr1}$ are generated, and both of the outputs CD1 and $\overline{CD1}$ of the shift register SR are set to the low level.

The coincidence detection pulse $\overline{\phi cc}$ is generated when these output signals CD1 and $\overline{CD1}$ are at the low level.

When this detection pulse $\overline{\phi cc}$ is generated, the control signal $\phi sr1$ is raised to the high level for a predetermined period. Therefore, the generation of the advance pulse $\phi$ from the timer circuit TM is inhibited.

The address counter ACNT is constructed with nine binary counters and hence has the counter number of 0 to 511. Therefore, when the first detection pulse $\overline{\phi cc}$ is generated, the count in the address counter ACNT is returned from 511 to 0.

The shift operation of the shift register SR is not executed during the period in which the control signal $\phi sr2$ is at the high level.

When the control signal $\phi sr2$ is returned to the low level after a predetermined period, the timer circuit TM is operated in response thereto. As a result, the advance pulse $\phi$ is generated by the timer circuit TM.

The address counter ACNT is incremented by 1. In this case, the count number when the first detection pulse $\overline{\phi cc}$ is generated is 0 as described above, the increased count number is 1. That is, it becomes a value designating the second word line.

The row system circuits are again operated in response to the change of the output of the address counter ACNT.

The preset signal $\phi ps$ is again set to the high level for a predetermined period in response to the first word line selection signal $\phi x$ after the control signal $\phi sr2$ is returned to the low level. As a result, the data signals read out from the memory cells connected to the second word line are set to the shift register SR.

The gate control signal $\phi gc$ is raised again to the high level in synchronism with the change of the preset signal $\phi ps$ to the low level. Thus, the same operations as those described already are carried out.

Since the additional unit shift stage described already is disposed in this embodiment, the shift register SR has the number of unit shift stage which is greater by one than the number of data line pairs. Therefore, the preset signal $\phi ps$ is generated at a timing such that a plurality of word lines can be sequentially selected.

The present invention provides the following effects.

(1) Since the memory cells are selected by the built-in address counter, continuous read-out can be made without supplying external address signals.

(2) Due to the effect described in item (1), a semiconductor memory suitable for a refresh memory for displaying characters or figures on CRT can be obtained. In other words, an external address signal generation circuit consisting of a microprocessor or the like is unnecessary, and the system can be simplified.

(3) The address counter of the automatic refresh circuit is used as the address counter described above to select the word line direction, and the shift register is used to select the data line direction. Therefore, the circuit can be simplified and high speed data read-out can be made. For, when the shift register is used, a column change-over operation involving the resetting of the common data line is not necessary.

Though the invention has thus been described with reference to some preferred embodiments thereof, the invention is not particularly limited to these embodiments, but can of course be changed or modified in various ways without departing from the spirit and scope thereof. For example, the shift clock of the shift register may be supplied from an external terminal. A column selection address counter circuit may be disposed in place of the shift register. Furthermore, various combinations of external control signals for executing continuous read-out may be employed, or new control signals may be disposed.

Though the invention has thus been described primarily with reference to a dynamic RAM which is the background and field of utilization of the invention, the present invention is not particularly limited thereto, but can also be applied to a static type RAM by adding an address generation circuit so as to add the similar operation functions.

What is claimed is:

1. A semiconductor memory comprising:
a memory array having a plurality of memory cells;
first means for generating timing signals in a time series manner without the need of receiving external clock signals;
an address counter coupled to said first means, said address counter including means for generating address data designating memory cells from said memory array in response to the timing signals of said first means; and
second means coupled to said memory array and to an external terminal, said second means including means for serially transmitting data stored in memory cells designated by said address counter to said external terminal.

2. A semiconductor memory according to claim 1, wherein each of said memory cells comprises a dynamic type memory cell.

3. A semiconductor memory according to claim 2, further comprising:
an address buffer circuit providing internal address signals for said memory array in response to external address signals;
a multiplexor coupled between said memory array and said address buffer and between said memory array and said address counter; and
control means including means for controlling said multiplexor to select either internal address signals generated by said address buffer circuit or address data generated by said address counter to apply to said memory array.

4. A semiconductor memory comprising:
a memory array including a plurality of memory cells arranged in rows and columns;
first means for generating timing signals in a time series manner without the need of receiving external clock signals;
an address counter coupled to said first means, said address counter including means for generating address signals designating a memory cell row from said memory array in response to the timing signal of said first means, so that said memory cell rows are sequentially designated by said address counter in accordance with the timing signal of said first means; and
second means coupled to said memory array and to an external terminal, said second means including means for serially transmitting data stored in the memory cell row designated by said address counter to said external terminal.

5. A semiconductor memory according to claim 4, wherein said second means comprises converting means coupled to said external terminal and which converts parallel data into serial data, and transmitting means coupled between said memory array and said converting means and which transmits data stored in memory cells designated by said address counter to said converting means in parallel, and wherein said control means further includes means for controlling said converting means so that said converting means serially provides data applied to said converting means by said transmitting means to said external terminal.

6. A semiconductor memory according to claim 5, wherein said converting means includes a shift register.

7. A semiconductor memory according to claim 6, wherein each of said memory cells comprises a dynamic type memory cell.

8. A semiconductor memory according to claim 7, further comprising an address decoder coupled between said memory array and said address counter.

9. A semiconductor memory according to claim 8, further comprising a control circuit, wherein said second means comprises a converting means which is coupled to said external terminal and which converts parallel data into serial data, and a transmitting means which is coupled between said memory array and said converting means and which transmits data stored in the memory cell row designated by said address counter to said converting means in parallel, and wherein said control circuit includes means for controlling said converting means so that said converting means serially provides data applied to said converting means by said transmitting means to said external terminal.

10. A semiconductor memory according to claim 9, wherein said first means includes means for controlling said address counter so that said address counter designates a different memory cell row when said converting means transmits all of the data stored in a previously designated memory cell row to said external terminal.

11. A semiconductor memory according to claim 10, wherein said converting means includes a shift register.

12. A semiconductor memory according to claim 10, wherein said first means comprises a timer circuit for generating said timing signals.

13. A semiconductor memory comprising:
a memory array including a plurality of memory cells arranged in rows and columns;
first means for generating timing signals in a time series manner without the need of receiving external clock signals;
an address counter coupled to said first means, said address counter including means for generating address signals in response to the timing signals of said first means;
an address buffer circuit providing internal address signals in response to external address signals;
a multiplexor coupled between said memory array and said address buffer and between said memory array and said address counter;
control means including means for controlling said multiplexor to select either the internal address signals generated by said address buffer circuit or the address signals generated by said address counter;
an address decoder coupled between said memory array and said multiplexor, said address decoder including means for selecting a memory cell row from said memory array in response to the address signals selected by said multiplexor; and
second means coupled to said memory array and to an external terminal, said second means including means for serially transmitting data stored in a memory cell row, which memory cell row is selected by the address signals which said address counter generates, to said external terminal in series.

14. A semiconductor memory according to claim 13, wherein each of said memory cells comprises a dynamic type memory cell.

15. A semiconductor memory according to claim 14, wherein said second means comprises converting means coupled to said external terminal and which converts parallel data into serial data, and transmitting means coupled between said memory array and said converting means and which transmits data stored in the memory cell row selected by the address signals of said address counter to said converting means in parallel, and wherein said control means further includes means for controlling said converting means so that said converting means serially provides data applied to said converting means by said transmitting means to said external terminal.

16. A semiconductor memory according to claim 15, wherein said first means includes means for controlling said address counter so that said address counter designates a different memory cell row when said converting means transmits all of the data stored in a previously designated memory cell row to said external terminal.

17. A semiconductor memory according to claim 16, wherein said converting means includes a shift register.

18. A semiconductor memory comprising:
a memory array including a plurality of memory cells arranged in rows and columns;
first means for generating timing signals in a time series manner without the need of receiving external clock signals;
an address counter coupled to said first means, said address counter including means for generating address signals in response to the timing signals of said first means without the need of receiving external address signals;
an address buffer circuit providing internal address signals in response to external address signals;
a multiplexor coupled between said memory array and said address buffer and between said memory array and said address counter;
control means including means for controlling said multiplexor to select either the internal address signals generated by said address buffer circuit or the address signals generated by said address counter;
an address decoder coupled between said memory array and said multiplexor, said address decoder including means for selecting a memory cell row from said memory array in response to the address signals selected by said multiplexor; and
second means coupled to said memory array and to an external terminal, said second means including means for serially transmitting data stored in a memory cell row, which memory cell row is selected by the address signals which said address counter generates, to said external terminal in series.

19. A semiconductor memory according to claim 18, wherein each of said memory cells comprises a dynamic type memory cell.

20. A semiconductor memory according to claim 19, wherein said second means comprises converting means coupled to said external terminal and which converts parallel data into serial data, and transmitting means coupled between said memory array and said converting means and which transmits data stored in the memory cell row selected by the address signals of said address counter to said converting means in parallel, and wherein said control means further includes means for controlling said converting means so that said converting means serially provides data applied to said converting means by said transmitting means to said external terminal.

21. A semiconductor memory according to claim 20, wherein said first means includes means for controlling said address counter so that said address counter designates a different memory cell row when said converting means transmits all of the data stored in a previously designated memory cell row to said external terminal.

22. A semiconductor member according to claim 21, wherein said converting means includes a shift register.

23. A semiconductor memory comprising:
a memory array including a plurality of memory cells arranged in rows and columns;
address counter means including means for generating address signals designating a memory cell row from said memory array;
address decoder means coupled between said memory array and said address counter means, said address decoder means including means for selecting the memory cell row from said memory array in accordance with the address signals generated by said address counter means; and
data transmitting means coupled to said memory array and to an external terminal, said data transmitting means including means for serially transmitting data stored in the memory cell row selected by said address decoder means to said external terminal.

24. A semiconductor memory according to claim 23, wherein each of said memory cells includes a dynamic type memory cell.

25. A semiconductor memory according to claim 24, further comprising a control circuit, wherein said data transmitting means comprises converting means coupled to said external terminal and which converts parallel data into serial data, and transmitting means coupled between said memory array and said converting means and which transmits data stored in the memory cell row selected by said address decoder means to said converting means in parallel, and wherein said control circuit includes means for controlling said converting means so that said converting means serially provides data applied to said converting means by said transmitting means to said external terminal.

26. A semiconductor memory comprising:
a memory array having a plurality of memory cells;
first means coupled to said memory array, and for selecting memory cells from said memory array;
an external terminal;
second means coupled between said memory array and said external terminal, said second means including means for serially transmitting data stored in memory cells selected by said first means to said external terminal in accordance with clock signals; and
clock signal generating means for generating said clock signals.

27. A semiconductor memory according to claim 26, further comprising a control circuit coupled to said clock signal generating means and to an external terminal for receiving a control signal, wherein said control circuit controls the operation of said clock signal generating means in response to the control signal.

28. A semiconductor memory according to claim 27, wherein each of said memory cells includes a dynamic type memory cell.

29. A semiconductor memory comprising:
a memory array having a plurality of memory cells;
first means coupled to said memory array, and for selecting memory cells from said memory array;
an external terminal;
second means coupled between said memory array and said external terminal, wherein said second means comprises converting means coupled to said external terminal and which converts parallel data into serial data, and transmitting means coupled between said memory array and said converting means and which transmits data stored in the memory cell row selected by the address signals of said address counter to said converting means in parallel; and
control means including means for controlling said converting means so that said converting means serially provides data applied to said converting means by said transmitting means to said external terminal, and wherein said second means includes detecting means for detecting a time when said converting means provides all of the data to said external terminal.

30. A semiconductor memory according to claim 29, wherein said first means includes means responsive to the output signal of said detecting means, for detecting different memory cells from previously selected memory cells.

31. A semiconductor memory according to claim 30, wherein each of said memory cells includes a dynamic type memory cell.

32. A semiconductor memory comprising:
a memory array including a plurality of dynamic memory cells arranged in rows and columns;
an external terminal;
first means coupled between said memory array and said external terminal, wherein said first means includes converting means coupled to said external terminal and which converts parallel data into serial data, and transmitting means coupled between said memory array and said converting means and which transmits data stored in a memory cell row selected from said memory array to said converting means in parallel;
control means including means for controlling said converting means so that said converting means serially provides data applied to said converting means by said transmitting means to said external terminal; and
second means coupled to said memory array, and for selecting a memory cell row during the time that said converting means serially provides previous data to said external terminal, so that the refresh operation of memory cells is executed during said time.

33. A semiconductor memory according to claim 32, wherein said second means includes an address counter for generating address signals, and an address decoder circuit coupled between said memory array and said address counter and for selecting a memory cell row from said memory array.

34. A semiconductor memory according to claim 33, wherein each of said dynamic memory cells includes a switching MOSFET, and a capacitor means coupled to said switching MOSFET and for storing data.

35. A semiconductor memory according to claim 1, wherein said address counter generates said address data without the need of receiving external address signals.

36. A semiconductor memory according to claim 4, wherein said address counter generates said address data without the need of receiving external address signals.

* * * * *